(12) United States Patent
Yang et al.

(10) Patent No.: US 6,468,894 B1
(45) Date of Patent: Oct. 22, 2002

(54) METAL INTERCONNECTION STRUCTURE WITH DUMMY VIAS

(75) Inventors: Kai Yang, San Jose; Suzette K. Pangrle, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/813,309

(22) Filed: Mar. 21, 2001

(51) Int. Cl.⁷ .................................................. H01L 23/48
(52) U.S. Cl. ..................... 438/622; 438/253; 438/644; 438/678; 438/685
(58) Field of Search ................................ 438/644, 678, 438/685, 687, 240, 253, 254

(56) References Cited

U.S. PATENT DOCUMENTS 6,271,084 B1 * 8/2001 Tu et al. ..................... 438/253

* cited by examiner

Primary Examiner—David Nelms
Assistant Examiner—Mai-Huong Tran

(57) ABSTRACT

A metal interconnect structure and method of making the same provides a low k dielectric layer on a substrate that contains the first metal line. A plurality of vias are formed in the low k dielectric layer, along with a second metal line. A first set of the plurality of vias are connected between the first and second metal lines, and a second set of the plurality of vias are not connected between the first and second metal lines. The second set of vias form dummy vias that increase the mechanical strength of the via layer and increase the resistance to delamination and scratching during chemical mechanical polishing.

11 Claims, 4 Drawing Sheets

METAL INTERCONNECTION STRUCTURE WITH DUMMY VIAS

FIELD OF THE INVENTION

The present invention relates to the field of metal interconnect formation for semiconductors, and more particularly to be the use of low k dielectric materials in metal interconnect structures.

BACKGROUND OF THE INVENTION

The escalating requirements for high-density and performance associated with ultra-large scale integration semiconductor wiring require responsive changes in interconnection technology. These escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole while a conductive plug filling a contact hole establishes electrical contact with an active region on a semiconductor substrate, such as a source/drain region. Conductive lines are formed in trenches which typically extend substantially horizontally with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques, and filling the opening with conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with conductive material, typically a metal, to simultaneously form a conductive plug and electrical contact with a conductive line.

In efforts to improve the operating performance of a chip, low k dielectric materials have been increasingly investigated for use as replacements for dielectric materials with higher k values. Lowering the overall k value of the dielectric layers employed in the metal interconnect layers lowers the RC of the chip and improves its performance. However, low k materials such as benzocyclobutene (BCB), hydrogen silsesquioxane (HSQ), SiOF, etc., are often more difficult to handle than traditionally employed higher k materials, such as an oxide. For example, low k dielectric materials are readily damaged by techniques used to remove photoresist materials after the patterning of a layer. Hence, a feature formed in a low k dielectric layer may be damaged when the photoresist layer used to form the feature (e.g., trench or via) is removed.

One of the problems with low k materials is the relatively low mechanical strength of such materials. This low mechanical strength makes the low k material susceptible to delamination, and scratching during chemical mechanical polishing (CMP). It has been found that those areas of a low k dielectric layer that have a greater copper density are more resistant to delamination and scratching.

This is a particular problem in via layers, which normally have a relatively low copper pattern density. Hence, via layers typically exhibit the highest tendency for delamination. This causes the metal interconnection layers to be poorly formed, leading to possible failure of the device.

SUMMARY OF THE INVENTION

There is a need for a metal interconnect structure and method of making the same that employs low k dielectric materials in a via layer, but has a reduced tendency for delamination and increased resistance to scratching during chemical mechanical polishing.

This and other needs are met by embodiments of the present invention which provide a method of forming metal interconnect layers comprising the steps of forming a low k dielectric layer on a substrate that contains a first metal line. A plurality of vias are formed in the low k dielectric layer. A second metal line is formed in the low k dielectric layer. A first set of the plurality of vias are connected between the first and second metal lines. A second set of the plurality of vias are not connected between the first and second metal lines.

By providing a second set of vias that are not connected (i.e. dummy vias) between the first and second metal lines in a low k dielectric layer, the metal pattern density in the via layer is increased.

This makes the via layer more resistant to delamination and scratching to reduce defects caused by these concerns.

In certain embodiments, the plurality of vias and the second metal line are formed in a single damascene manner, while in other embodiments the plurality of vias and the second metal line are formed in a dual damascene manner.

The earlier stated need is also met by other embodiments of the present invention which provide a metal interconnect arrangement comprising a first metal layer containing first metal lines. A low k dielectric layer is provided on the first metal layer. A plurality of vias are in the low k dielectric layer. A first set of the vias electrically contact at least one of the first metal lines. A second set of the vias do not electrically contact any of the first metal lines. A second metal layer is provided on the low k dielectric layer. This second metal layer contains second metal lines. At least some of the plurality of vias electrically contact only one of the first or second metal lines.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the use of low k dielectric materials in metal interconnect structures, including the problems of delamination and scratching 10 during chemical mechanical polishing. These problems are solved, in part, by the present invention that provides dummy vias in the via layer. These dummy vias increase the density of the metal within the via layer. The higher pattern density of metal reduces the tendency of the via layer to delaminate and makes the via layer more resistant to scratching.

Figure 1:
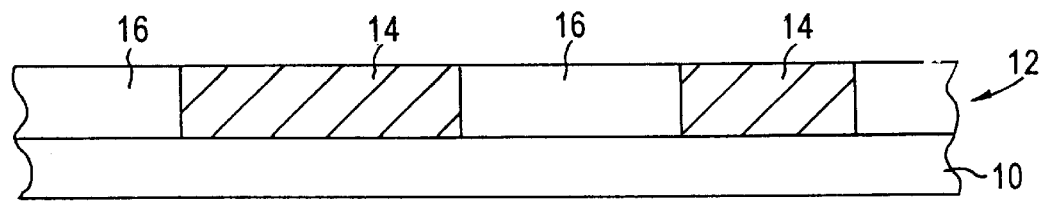
FIG. 1 depicts a cross-section of a first metal line layer at one stage of a method for producing a metal interconnect structure in accordance with embodiments of the present invention.

FIG. 1 depicts a metal interconnect portion of a semiconductor device in a cross-section view, taken during one step of the method of forming the metal interconnect portion in accordance with embodiments of the present invention. In particular, FIGS. 1–7 depict a single damascene manner of forming the metal interconnect structure.

In FIG. 1, a first metal layer 12 is provided on a substrate 10, which may be another metallization layer or a device layer. First metal layer 12 includes conductive metal lines 14 separated by dielectric material, such as low k dielectric material 16. In certain embodiments of the present invention, the first metal lines 14 are made of copper or a copper alloy, as copper has been increasingly employed due to its advantageous properties in comparison to aluminum or other metals. Moreover, the present invention is not limited to the use of copper or copper alloy, but rather may be used with other metals conventionally used in interconnect technology, such as aluminum. The low k dielectric material 16 may be any of a number of different suitable low k dielectric materials employed in interconnect technology. For example, the low k dielectric material may be an organic material, such as benzocyclobutene (BCB), SILK, FLARE, etc. Alternatively, the low k dielectric material 16 may be an inorganic dielectric material, such as methyl silsesquioxane (MSQ), hydrogen silsesquioxane (HSQ), SiOF, e.g. These materials are exemplary only as other embodiments include different low k dielectric materials.

Following the formation of the first metal lines 14, additional low k dielectric material 18 is formed on the first metal layer 12. In certain preferred embodiments of the invention, an etch stop layer 17 is deposited over the first metal layer 12 prior to the formation of the additional low k dielectric material 18. The etch stop layer 17 provides an etch stop during subsequent processing, as well as protects the first metal lines 14 during the etching of the additional low dielectric material 18. A suitable material for the etch stop layer 17 is silicon nitride or silicon carbide, for example. Silicon carbide may be preferred due to its lower k value than silicon nitride.

Figure 2:
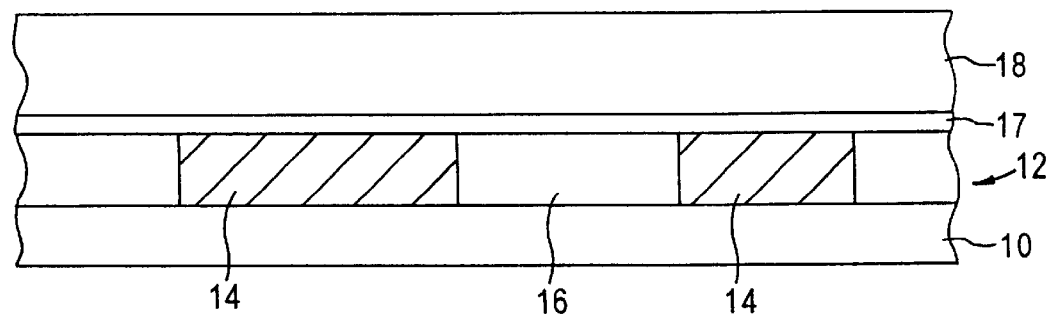
FIG. 2 depicts a cross-section of FIG. 1 after the formation of additional low k dielectric material on the first metal line layer.
Figure 3:
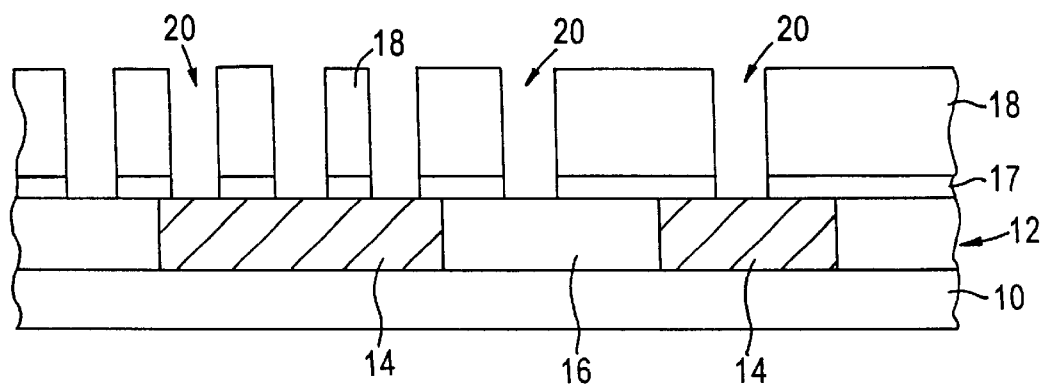
FIG. 3 shows the cross-section of FIG. 2 following the patterning and formation of via holes on the additional low k dielectric material.

FIG. 3 depicts the metal interconnect portion of FIG. 2 following the patterning and etching of via holes 20 in the additional low k dielectric material 18. The patterning and etching is performed using conventional techniques of photolithography and etching known to those of ordinary skill in the art. The etchant chemistry is selected so as to etch the additional low k dielectric material 18 and stop on the etch stop layer 17. The etch stop material of layer 17 is then removed within each of the via holes 20 by an etchant chemistry that is selective for the etch stop material in layer 17. The photoresist material used in patterning the additional low k dielectric material 18 has been removed in FIG. 3.

Figure 4:
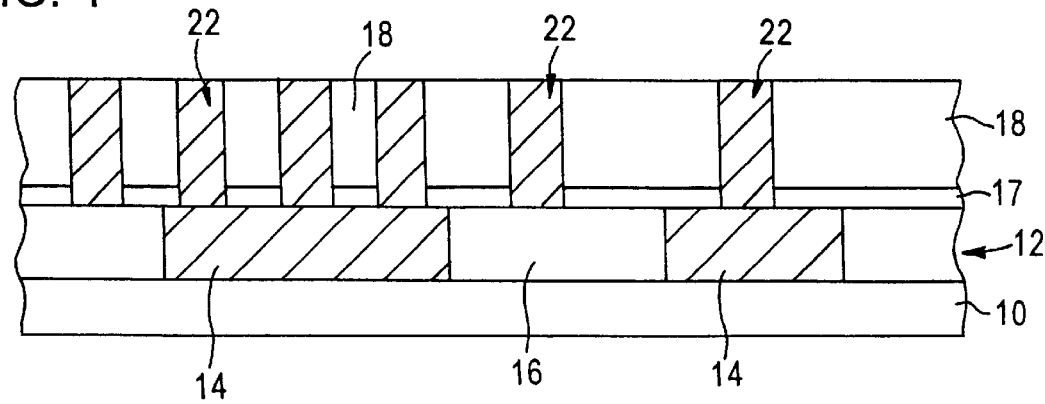
FIG. 4 shows the cross-section of FIG. 3 after the via holes have been filled with conductive material and planarized to form vias.

FIG. 4 depicts the metal interconnect portion of FIG. 3 after conductive material, such as copper or copper alloy, has been deposited into the via holes 20 to form conductive vias 22. Electroless deposition or electroplating may be employed, for example. When copper or copper alloy is used as the conductive material, a barrier layer (such as titanium nitride, tantalum, or tantalum nitride) may first be deposited within the via holes, 20 followed by a seed layer prior to the filling of the via holes 20. The barrier material prevents diffusion of the copper into the surrounding low k dielectric material. The barrier material and the seed layer are not depicted in FIG. 4 so as to not obscure the present invention. As will be appreciated in FIG. 7, only some of the vias 22 will actually provide connection between metal lines, with the vias unconnected performing only a mechanical strengthening function that helps to prevent delamination and scratching during chemical mechanical polishing. These other vias are "dummy vias." Also, in order to increase the density of the copper without significantly increasing parasitic capacitance, other vias are provided as redundant vias. These redundant vias connect between two conductive lines.

Figure 5:
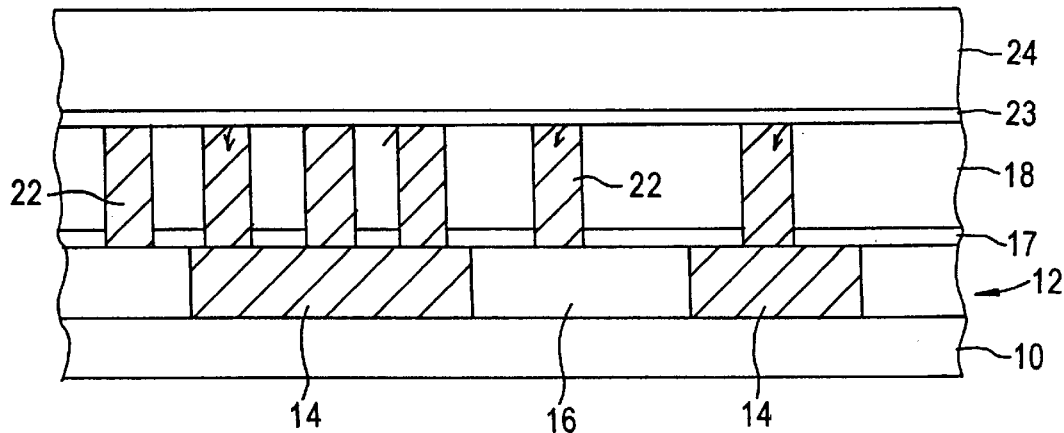
FIG. 5 depicts the cross-section of FIG. 4 following deposition of further low k dielectric material on the vias.

In FIG. 5, further additional low k dielectric material 24 is formed over the vias 22 and the additional low k dielectric material 18. Also, in FIG. 5, another etch stop layer 23 may be provided over the vias 22 and the additional low k dielectric material 18 prior to the formation of the further additional low k dielectric material 24. The etch stop layer 23 may be made of the same material as the etch stop layer 17 and serves the same function as the etch stop layer 17. The further additional low k dielectric material 24 may advantageously be made of the same material as the additional low k dielectric material 18. This reduces the possibility of incompatibility (e.g. thermal expansion, etc.) when different low k dielectric materials are used in the different sub-layers. Alternatively, if a different type of low k dielectric material is used in the further additional low k dielectric material 24, then an etch stop layer 23 may not be required. For example, if the additional low k dielectric material 18 is an organic low k dielectric material, and the further additional low k dielectric material 24 is an inorganic low k dielectric material, then an etchant may be selected that will etch only the inorganic low k dielectric material, substantially stopping on the organic low k dielectric material.

In FIG. 5, the low k dielectric layer may be considered to comprise sub-layers 16, 18, and 24. Alternatively, the low k dielectric layer may be considered to comprise the additional low k dielectric material 18 and the further additional low dielectric material 24. The low k dielectric layer would thus be formed on the first metal layer 12.

Figure 6:
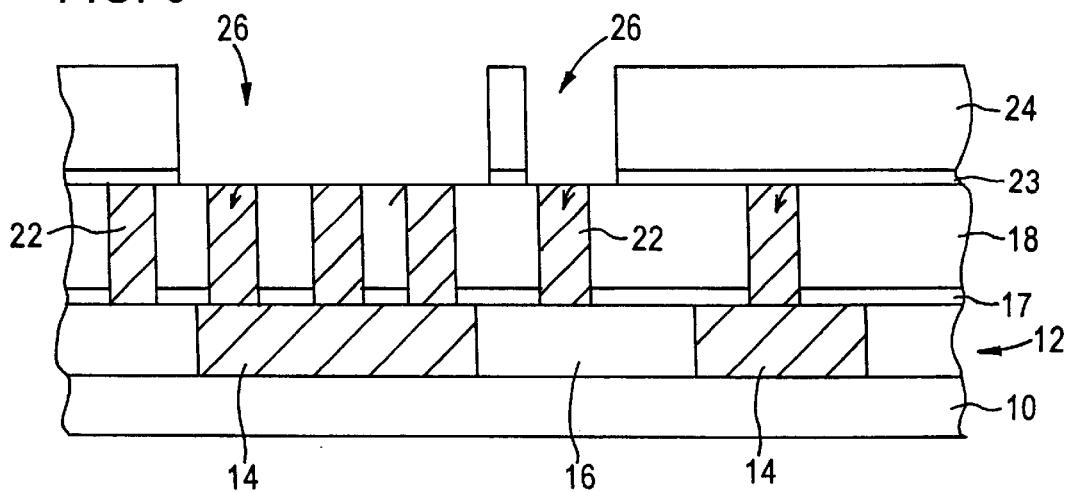
FIG. 6 shows the formation of trenches in the further deposited low k dielectric material.

In FIG. 6, trenches 26 have been formed by conventional photolithographic and etching techniques. These trenches overlie some of the conductive vias 22 and not other vias 22. The etching may be a two-step etch, with the low k dielectric material 24 being etched down to the etch stop layer 23, followed by removal of the etch stop layer 23 within each-of the trenches 26.

Figure 7:
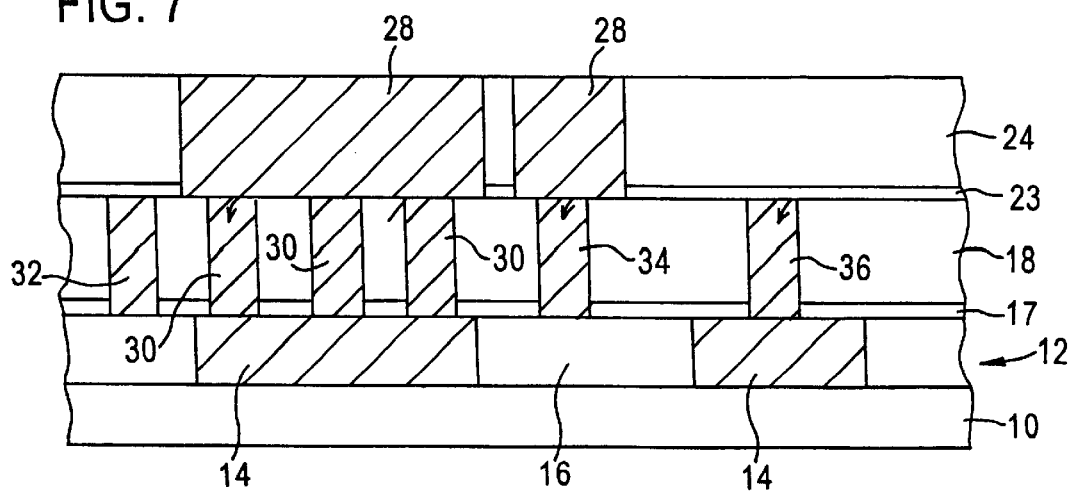
FIG. 7 depicts a deposition of a conductive material within the trenches to form conductive lines contacting some of the previously formed vias.

Conductive lines 28 are formed in FIG. 7 by the deposition of copper or copper alloy, in preferred embodiments, in trenches 26. As with the conductive vias 22, when copper or copper alloy is deposited, a barrier material and a seed layer are typically provided, although not shown in FIG. 7. Other materials besides copper may be employed as the conductive material in the lines 28, although copper is preferred.

As seen in FIG. 7, a number of conductive vias 30 are provided between the first metal line 14 and the second metal line 28. Some of these vias can be considered redundant vias which may be optimally used to increase the copper density without significantly increasing parasitic capacitance.

The vias 30 that are connected between the first and second metal lines 14, 28 can be considered a first set of vias. The remaining vias, which are not electrically connected between the first and second metal lines 14, 28, can be considered a second set of vias. For example, in FIG. 7, the second set of vias comprises vias 32, 34 and 36. These vias 32–36, along with the redundant vias 30, increase the copper density in the via layer, although the dummy vias do not provide an electrical connection. The dummy via 32 is a floating dummy via since it is not connected to any of the first or second metal lines 14, 28.

Via 34 may be considered a bottom floating dummy via since the via 34 is not connected to a first metal line 14, but is connected to a second metal line 28. Conversely, via 36 is considered a top floating dummy via since it is connected to a first metal line 14 but is not connected to a second metal line 28.

The single damascene structure of FIG. 7 exhibits increased resistance to delamination and scratches due to chemical mechanical polishing since the copper pattern density is increased by the dummy vias 32, 34 and 36, and the redundant vias 30. This improves the quality of the metal interconnect portion of the semiconductor device.

Figure 8:
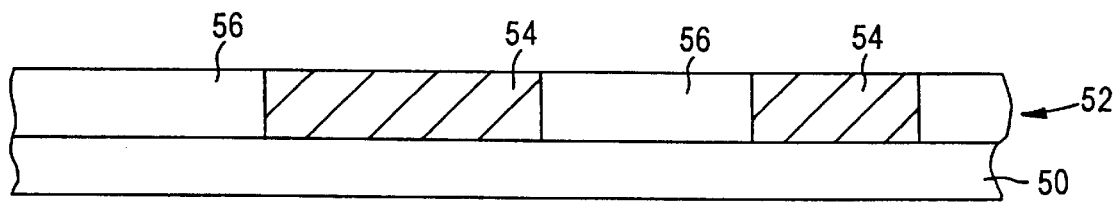
FIG. 8 depicts a cross-section of a portion of a metal interconnect structure during one step of a method for forming the metal interconnect structure in accordance with a dual damascene method of making an interconnect, in accordance with embodiments of the present invention.

FIGS. 8–12 depict a dual damascene manner of forming a metal interconnect structure employing embodiments of the present invention. FIG. 8 depicts the first metal layer 52 provided on a substrate 50, similar to that depicted in FIG. 1. The metal layer 52 includes first metal lines 54 spaced by low k dielectric material 56. As in FIG. 1, the low k dielectric material 56 may be any of a number of different types of low k dielectric materials. Also, the conductive metal used in first metal lines 54 are preferably copper or a copper alloy, although other types of metals may be used without departing from the present invention.

Figure 9:
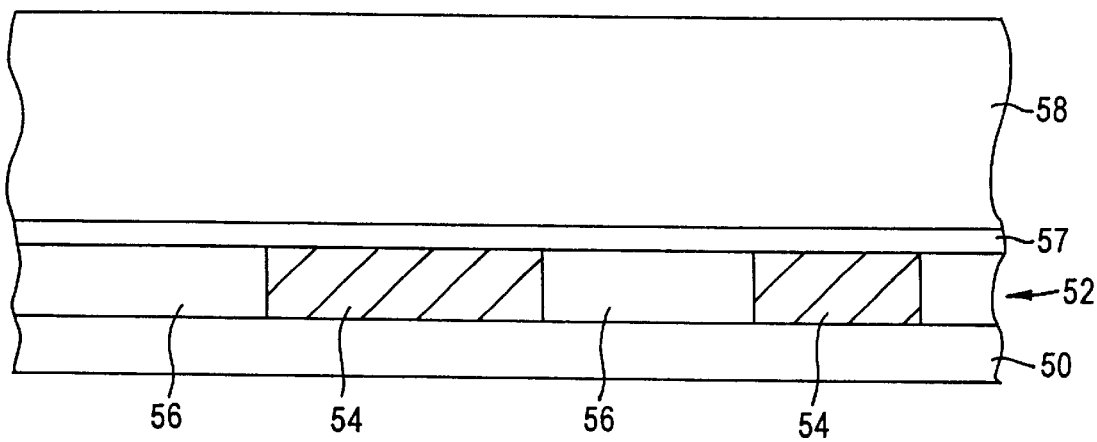
FIG. 9 shows the cross-section of FIG. 8 after additional low k dielectric material is deposited on a first metal line layer.

In FIG. 9, a low k dielectric material has been deposited as layer 58. Low k dielectric material 58 can be any of a number of different low k dielectric materials, either the same as or different from the low k dielectric material 56 in the first metal layer 52. If the materials are the same, an etch stop layer 57 is desirable to provide an etch stop and prevent damage to the underlying metal lines 54 during the etching of the low k dielectric layer 58.

Figure 10:
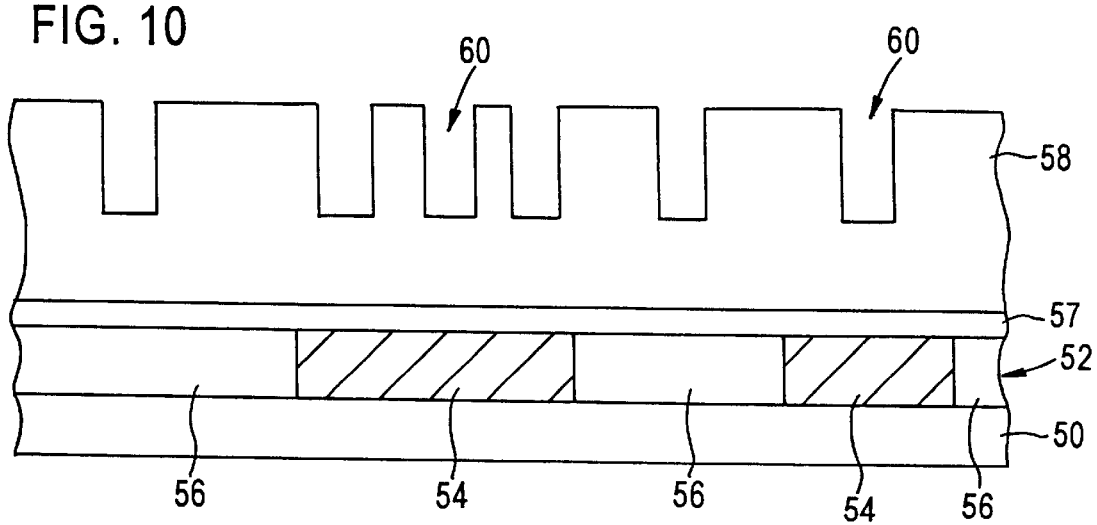
FIG. 10 depicts the cross-section of FIG. 9 following the etching of via openings in the upper portion of the dielectric layer.

FIG. 10 depicts the metal interconnect portion of FIG. 9 after the patterning and etching of via openings 60 in the low k dielectric layer 58. The patterning and etching may be performed in accordance with conventional photolithography and etching techniques. Etching may be a timed etch such that only an upper portion of the dielectric layer 58 is etched to a certain depth.

Figure 11:
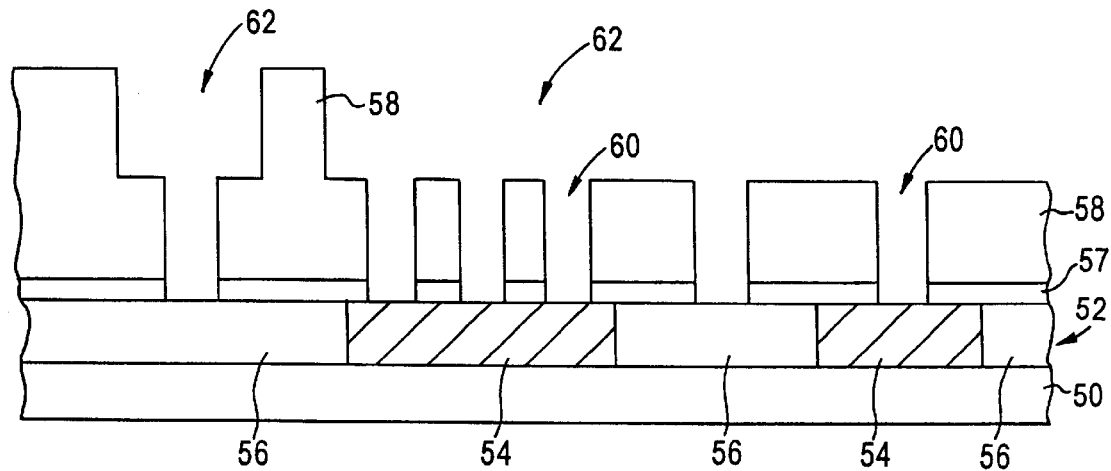
FIG. 11 depicts the cross-section of FIG. 10 after further patterning and etching has been performed to extend the via holes into the lower portion of the dielectric layer, and the formation of trenches in the upper portion of the low k dielectric layer.

Following the etching of the via hole 60, a second patterning and etching is performed to create trenches 62 in the upper portion of the dielectric layer 58. At the same time, the via holes 60 are extended downwardly to the etch stop layer 57. As seen in FIG. 11, the etch stop layer 57 within the via hole 60 is also removed, normally in a separate etching step. Hence, a structure having a trench line 62 and via hole 60 in communication with a trench 62 is created.

Figure 12:
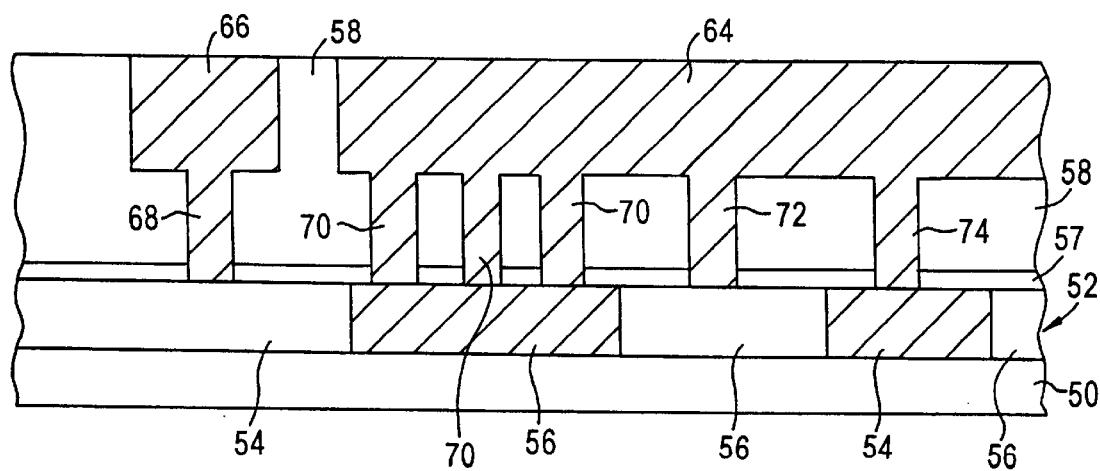
FIG. 12 shows the cross-section of FIG. 11 after the conductive material has been simultaneously deposited in the via holes and the trenches and planarized in accordance with embodiments of the present invention.

In FIG. 12, conductive material, such as copper or copper alloy, is deposited (by electroplating or electroless deposition, for example) to form conductive lines 64 and 66. These lines 64 and 66 may be considered second metal lines. Line 66 may be also considered a dummy line. In the dual damascene method of formation, each of the vias 68–74, depicted in FIG. 12, is connected to one of the second metal lines 64, 66. Hence, as in the single damascene structure of FIG. 7, the dual damascene structure of FIG. 12 includes a floating dummy via 68, redundant via 70, and a bottom floating via 72. It also includes another via 74 between the first and second metal lines 54, 64.

However, due to the nature of the dual damascene formation, the structure of FIG. 12 does not contain any top floating vias. Unlike second metal line 64, the other second metal line 66 in FIG. 12 is a dummy line that provides additional mechanical support to low k dielectric layer 58, but does not serve an interconnect function.

The use of dummy vias in a low k dielectric layer, formed by the single damascene or dual damascene methods of the present invention, increase the mechanical strength of the via layer to increase its resistance to delamination and scratching, which may be caused by chemical mechanical polishing.

Although the present invention has been described and illustrated in detail, it is to be clearly understood that the same is by way of illustration and example only and is not to be taken by way of limitation, scope of the present invention being limited only by the terms of appended claims.

What is claimed is:

1. A method of forming metal interconnect layers in a low k dielectric layer having a plurality of sub-layers, including the steps of:

forming a first sub-layer that contains a plurality of first metal lines;

forming over the first sub-layer a second sub-layer that contains a plurality of vias;

forming over the second sub-layer a third sub-layer that contains a plurality of second metal lines;

wherein a first set of the plurality of vias are connected between one of the first metal lines and one of the second metal lines, and a second set of the plurality of vias are not connected to any of the first metal lines and are not connected to any of the second metal lines.

2. A method of forming metal interconnect layers in a low k dielectric layer having a plurality of sub-layers, including the steps of forming a first sub-layer that contains a plurality of first metal lines;

forming over the first sub-layer a second sub-layer that contains a plurality of vias;

forming over the second sub-layer a third sub-layer that contains a plurality of second metal lines;

wherein a first set of the plurality of vias are connected between-one of the first metal lines and one of the second metal lines, and a second set of the plurality of vias are not connected to any of the first metal lines and are connected only to one of the second metal lines.

3. The method of claim 2, wherein the first set of the plurality of vias includes redundant vias.

4. The method of claim 3, wherein the plurality of vias are evenly distributed over the substrate.

5. The method of claim 4, wherein the first and second metal lines and the plurality of vias are made of copper or a copper alloy.

6. The method of claim 1, wherein the plurality of vias and the second metal line are formed in a dual damascene manner, with each of the plurality of vias being connected to at least the second metal line.

7. The method of claim 6, wherein the dual damascene manner includes forming via holes in the low k dielectric layer and trenches in the low k dielectric layer, the trenches being in communication with the vias.

8. The method of claim 7, wherein the dual damascene manner includes filling the via holes and the trenches simultaneously with conductive material to form vias and lines.

9. The method of claim 8, wherein the conductive material is copper or a copper alloy.

10. The method of claim 1, wherein the plurality of vias and the second metal line are formed in a single damascene manner.

11. The method of claim 10, wherein the single damascene manner includes forming the low k dielectric layer as first and second sub-layers, forming via holes in the first sub-layer, filling the via holes with conductive material to form vias, forming the second sub-layer on the first sub-layer and the vias, forming trenches in the second sub-layer, and filling the trenches with conductive material to form conductive lines.

* * * * *